United States Patent
Linardos et al.

(10) Patent No.: US 6,833,702 B1
(45) Date of Patent: Dec. 21, 2004

(54) SYSTEM, METHOD AND METHODOLOGY FOR RECONFIGURABILITY OF MAGNETIC RESONANCE IMAGERS

(75) Inventors: John Linardos, Smithtown, NY (US); Jevan Damadian, East Northport, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/236,909

(22) Filed: Sep. 9, 2002

Related U.S. Application Data

(60) Provisional application No. 60/317,450, filed on Sep. 7, 2001.

(51) Int. Cl.[7] .................................................. G01V 3/00
(52) U.S. Cl. ....................................... 324/309; 324/307
(58) Field of Search ................................. 324/309, 307, 324/306, 312, 314, 300

(56) References Cited

U.S. PATENT DOCUMENTS

| 5,465,361 A | * | 11/1995 | Hoenninger, III | ........... 717/168 |
| 5,519,320 A | * | 5/1996 | Kanayama et al. | ......... 324/309 |
| 6,348,793 B1 | * | 2/2002 | Balloni et al. | .............. 324/309 |

* cited by examiner

*Primary Examiner*—Louis Arana
(74) *Attorney, Agent, or Firm*—Nixon Peabody LLP; Raymond Van Dyke

(57) ABSTRACT

A method and apparatus to improve the efficiency of an MRI apparatus by allowing the controller of the MRI to be remotely reconfigured, allowing modification and upgrade of the hardware configuration of the controller. For complex or innovative pulse sequences, a customized hardware configuration of the controller may be necessary; for optimization of digital signal processing of the received data, reconfiguring the hardware configuration of the controller to perform the digital signal processing may be desirable.

14 Claims, 5 Drawing Sheets

Fig. 2
(Prior Art)
Fig. 3
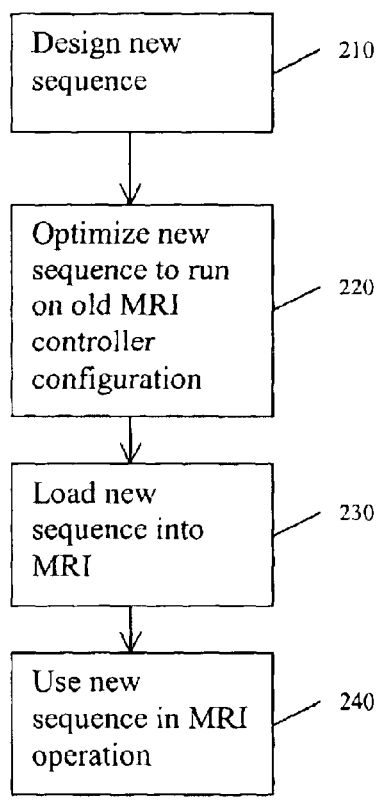
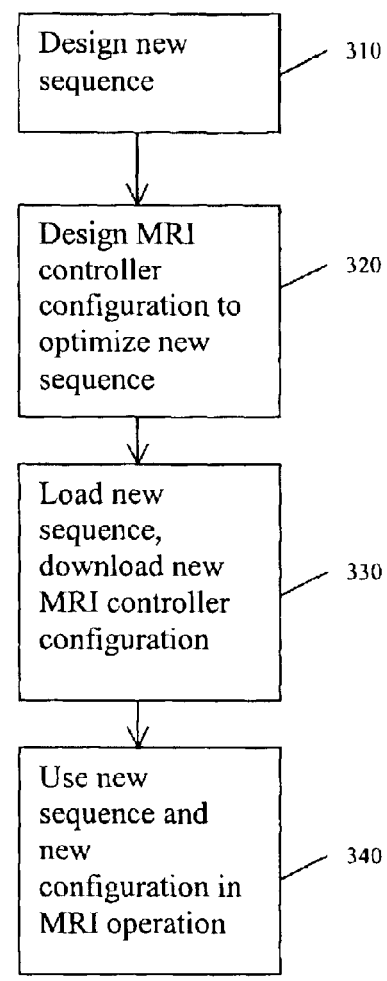

SYSTEM, METHOD AND METHODOLOGY FOR RECONFIGURABILITY OF MAGNETIC RESONANCE IMAGERS

This application claims the benefit of Provisional Application No. 60/317,450 filed Sep. 7, 2001.

TECHNICAL FIELD

The present invention is directed to magnetic resonance imaging (MRI) devices, and, particularly, to an improved technique for reconfiguring MRI devices.

BACKGROUND OF THE INVENTION

MRI technology permits the noninvasive imaging of internal details within an object, such as a living person. The scientific and diagnostic values of this technology are set forth in numerous prior art patents and articles, e.g., the many innovations of Dr. Raymond V. Damadian, the discoverer of this technology, as noted in the patent records.

Magnetic resonance imaging, also called nuclear magnetic resonance (NMR) imaging, is a non-destructive method for the analysis of materials and is used extensively in medical imaging. It is completely non-invasive and does not involve ionizing radiation. In very general terms, nuclear magnetic moments of individual atoms within a portion of a body are excited at specific spin precession frequencies which are proportional to the local magnetic field. The radio frequency (RF) signals resulting from the precession of these spins are received using pickup coils. By manipulating the magnetic fields, an array of signals is provided representing different regions of the volume. These are combined to produce a volumetric image which characterizes the nuclear spins within the body.

In MRI, a body is subjected to a constant magnetic field. Another magnetic field, in the form of electromagnetic (RF) pulses, is applied orthogonally to the constant magnetic field. The RF pulses have a particular frequency that is chosen to affect particular atoms (typically hydrogen) in the body. The RF pulses excite the atoms, increasing the energy state of the atoms. After the pulse, the atoms relax and release RF emissions, corresponding to the RF pulses, which are measured and displayed.

At the heart of an MRI device is a controller, which controls the pulse sequences, retrieves and stores the relaxation emissions, and sends this data to a computer which processes and displays the data. The controller may be a complex programmable logic device (CPLD), which includes a series of embedded array blocks (EABs) used to implement various memory and complex logic functions, as is understood to those skilled in the art. The respective EABs are physically configured in a desired manner to eliminate the need for discrete chips. The controller might also be another type of programmable logic device, such as a field programmable gate array (FPGA) or application specific integrated circuit (ASIC). It should also be understood that CPLD, FPGA, and ASIC boards are statically configured, ie., the board is so configured and stays so configured during the lifetime of use.

As noted, the hardware in present MRI systems is fixed. In particular, either the hardware is made of discrete logic or the respective CPLDs, FPGAs, ASICs, etc. that constitute the boards are physically configured and remain that way thereafter until obsolete.

Thus, in prior art techniques, the hardware is only designed to enable a generic MRI sequence run. Any newly-created sequence runs must, therefore, be designed to run on the generic configuration even if that configuration is inefficient or incorrect.

There is, therefore, a present need for an improved system and methodology for ameliorating or eliminating the inefficiencies in prior art MRI techniques, enabling MRI operators to readily reconfigure the hardware for a variety of potential sequences and hinder device obsolescence.

SUMMARY

The present invention provides a method and apparatus to improve the efficiency of an MRI apparatus by allowing the controller of the MRI to be remotely reconfigured, allowing modification and upgrade of the hardware configuration of the controller. For complex or innovative pulse sequences, a customized hardware configuration of the controller may be necessary; for optimization of digital signal processing of the received data, reconfiguring the hardware configuration of the controller to perform the digital signal processing may be desirable.

BRIEF DESCRIPTION OF THE DRAWINGS

The features, aspects, and advantages of the present invention will become better understood with regard to the following description, appended claims, and accompanying drawings where:

FIG. 2 illustrates a flowchart showing the development of a new sequence for a statically-configured MRI controller;

FIG. 3 illustrates a flowchart showing the development of a new sequence for a reconfigurable MRI controller in accordance with an embodiment of the present invention;

DETAILED DESCRIPTION

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

Figure 1:
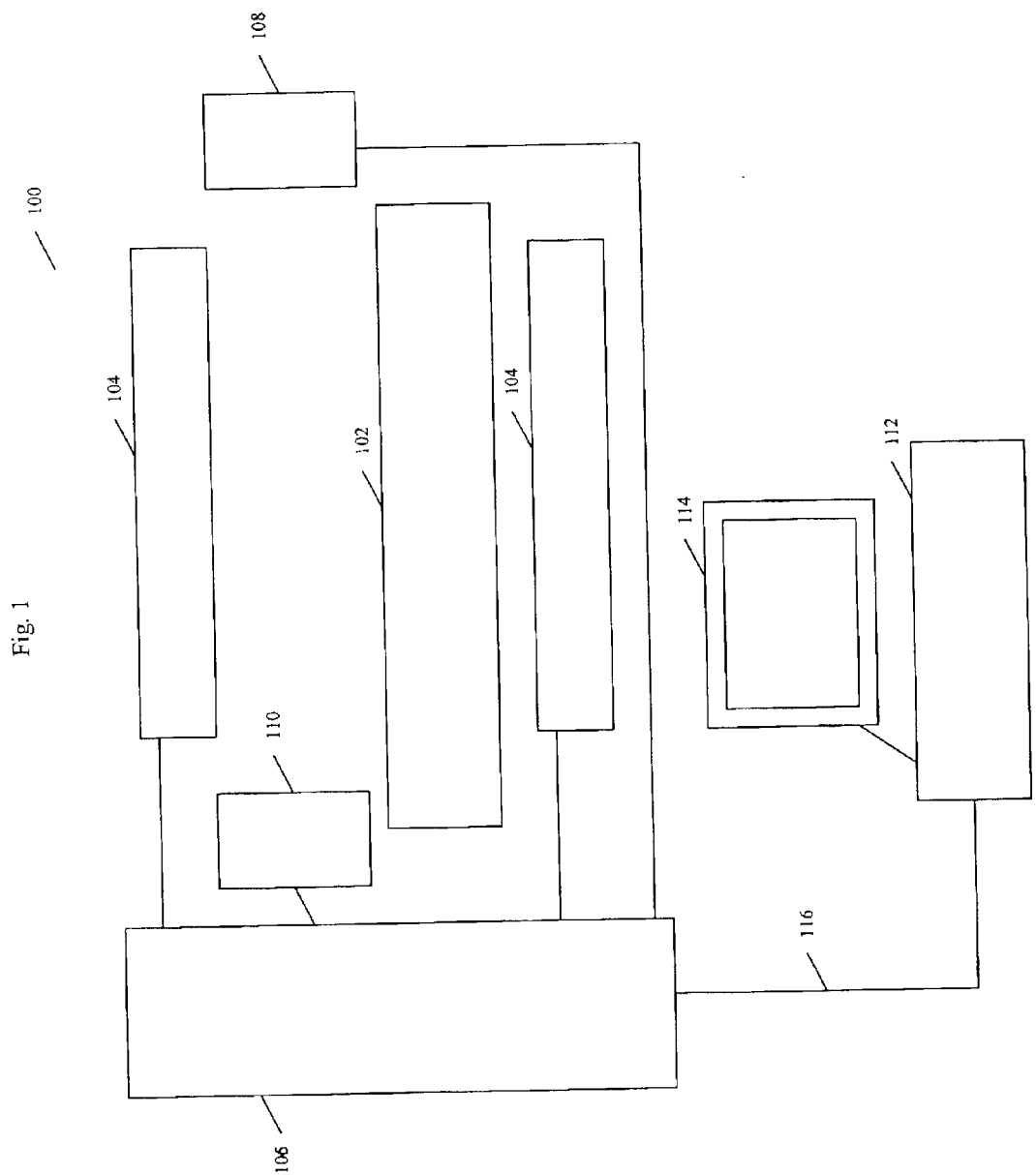
FIG. 1 illustrates various components of an MRI machine.

A Magnetic Resonance Imaging (MRI) apparatus is shown in FIG. 1, and generally designated by the reference numeral 100. The MRI apparatus 100 has a bed 102, where the object being examined is placed. The object may be a physical culture, a person, an animal, or any other physical object, as is understood in the art. The bed 102 is surrounded by magnetic coils, generally designated by the reference numerals 104, which generate the constant magnetic field, as described above.

With further reference to FIG. 1, there is illustrated an MRI controller 106 for controlling an RF signal generator 108 that creates the RF pulses that excite the atoms of the object being examined. As is understood in the art, the controller 106 receives and stores the information from an RF coil 110 that receives the relaxation RF signals from the atoms in the object. Typically, the atoms are hydrogen atoms, but, as is understood in the art, may be any other atom having appropriate characteristics. With further reference to FIG. 1, the MRI apparatus 100 is connected to a computer 112 processes the data received from the controller 106 and displays the information on a monitor 114.

In a conventional MRI apparatus, the MRI controller 106, which generates the pulse sequence, receives the relaxation signals, and sends the data to the computer 112 for processing and display of the information, is a system that consists of statically-configured logic devices, such as a CPLD, FPGA, ASIC, etc.

As noted, the prior art conventions and practices employ static hardware, and those utilizing such devices learn to work around the hardware configurations to achieve their objectives, if able. In the present invention, however, the MRI controller 106 is a reconfigurable logic device that may be reprogrammed remotely, without removal of the board from the physical MRI apparatus. This constitutes a paradigm shift in operating an MRI and fulfills a long-standing and long-felt need in this industry. The MRI controller 106 may, for example, be connected to the computer 112 by a cable 116 such that the user may load a new hardware configuration for the controller 106 onto the computer 112 and then later download the new hardware configuration onto the controller 106.

With respect now to FIG. 2, a conventional method of developing a new sequence is illustrated, referring for reference to the MRI apparatus 100 shown in FIG. 1, in which the MRI apparatus 100 configuration is, in this instance, static. First, a new pulse sequence is developed that facilitates a more efficient MRI scanning technique (step 210). The pulse sequence may be designed to more effectively utilize a specific scanning technique, such as T1-weighted, T2-weighted, or balanced T1- and T2-weighted scanning, as are already well-known in the art, as well as other and more sophisticated pulse sequences made possible in this new paradigm of operation.

The pulse sequence may also be designed to more effectively utilize any scanning technique, such as by increasing the overall signal-to-noise ratio or by requiring less power. Next, the new pulse sequence is optimized to run on the existing MRI controller configuration (step 220). As discussed, innovative and complex pulse sequences may need to be significantly redesigned in order to run on an existing configuration that is geared for generic pulse sequences. In order to run optimally on such existing and statically-configured systems, the effectiveness of the new pulse sequence may be reduced, or the new pulse sequence may need to be modified to run incorrectly for purposes of compatibility. After the pulse sequence has been thus "optimized" for the hardware controller 106 of the MRI apparatus 100, the new sequence is loaded onto the MRI apparatus 100 (step 230) and the new sequence is used in operation (step 240).

It should, of course, be understood that one skilled in the art of pulse sequence optimization may apply steps 210 and 220 simultaneously. Steps 210 to 240 are illustrative only of the complicated and time-consuming process of pulse sequence design.

According to a preferred embodiment of the present invention, the MRI apparatus has a remotely-reconfigurable MRI controller 106. A method of developing a new pulse sequence for use on the reconfigurable MRI apparatus 100 is shown in FIG. 3. First, a new pulse sequence is developed (step 310), as described above. Specifically, the pulse sequence may be designed to more effectively utilize a specific scanning technique, such as T1-weighted, T2-weighted, balanced T1- and T2-weighted scanning, or more sophisticated pulse sequence designs, or may be designed to more effectively utilize any scanning technique, such as by increasing the overall signal-to-noise ratio or by requiring less power. Next, the hardware configuration of the controller 106 is redesigned to optimally run the new pulse sequence (step 320). As discussed, complex or newly-designed pulse sequences may not operate efficiently or correctly on a generically-configured controller 106 and may require a custom design for the configuration of the controller 106. The new pulse sequence, contoured to optimize operations, is loaded onto the MRI controller 106 and the new hardware configuration is downloaded to the MRI controller 106 (step 330). The download may be in response to a separate reconfigure command, or the reconfigure command may be the same as the download. The new sequence is then used in operation (step 340).

Figure 4:
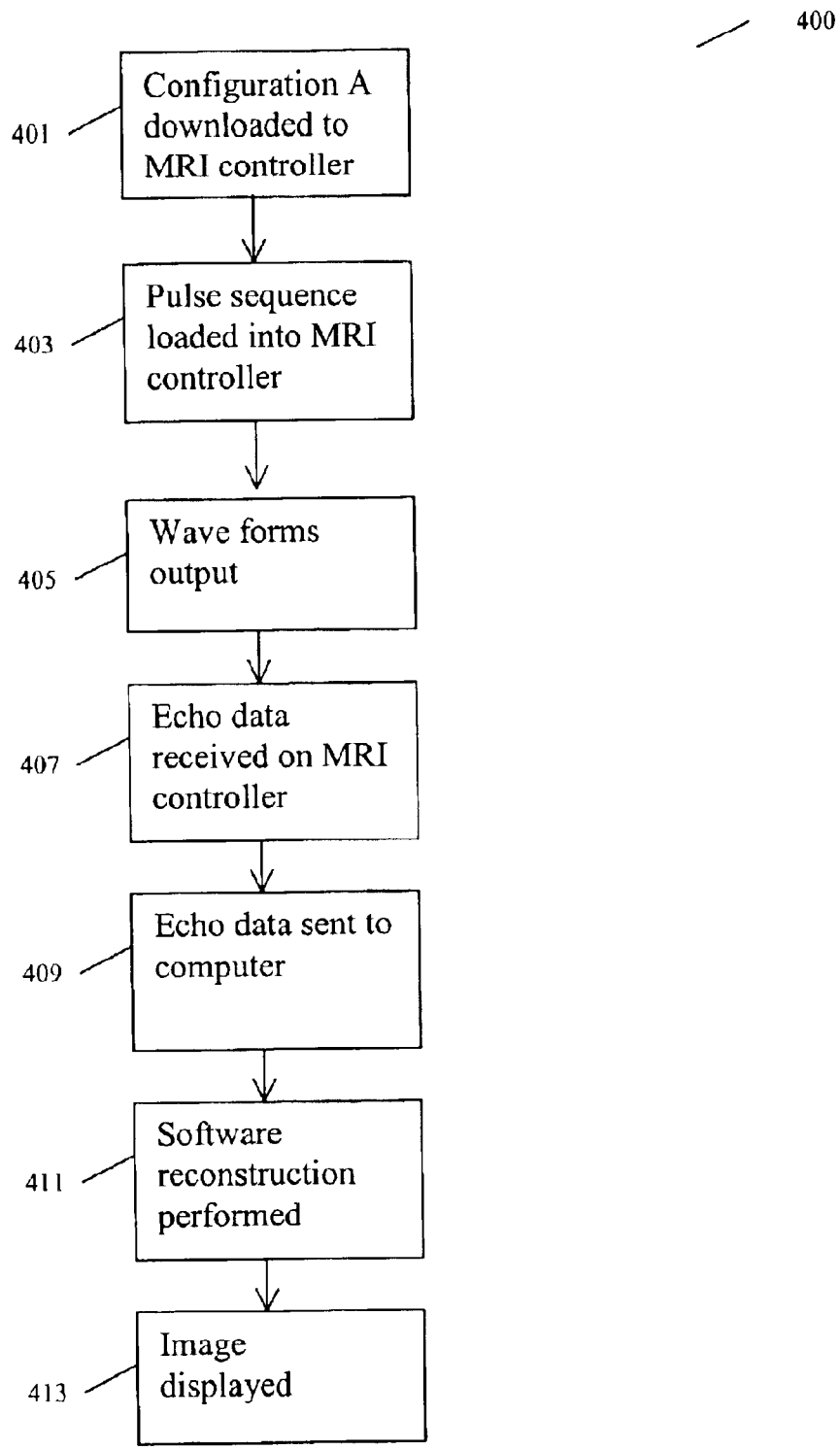
FIG. 4 illustrates a flowchart showing the conventional operation of an MRI machine.
Figure 5:
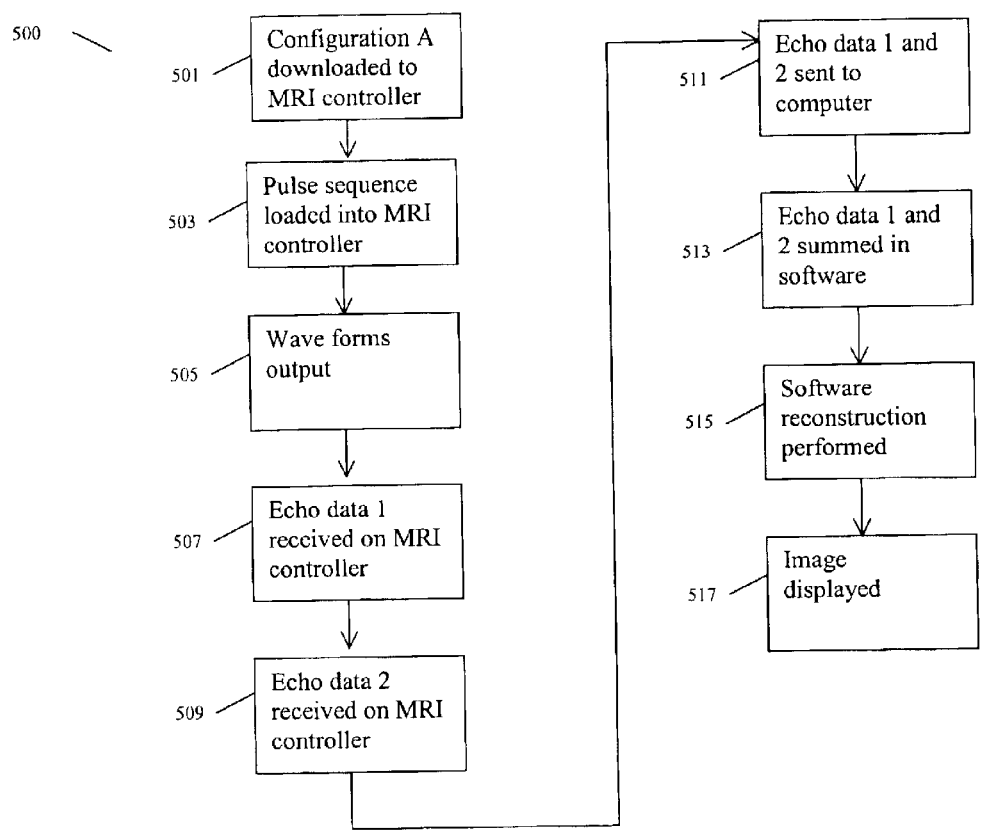
FIG. 5 illustrates a flowchart showing the conventional operation of an MRI machine performing digital signal processing.
Figure 6:
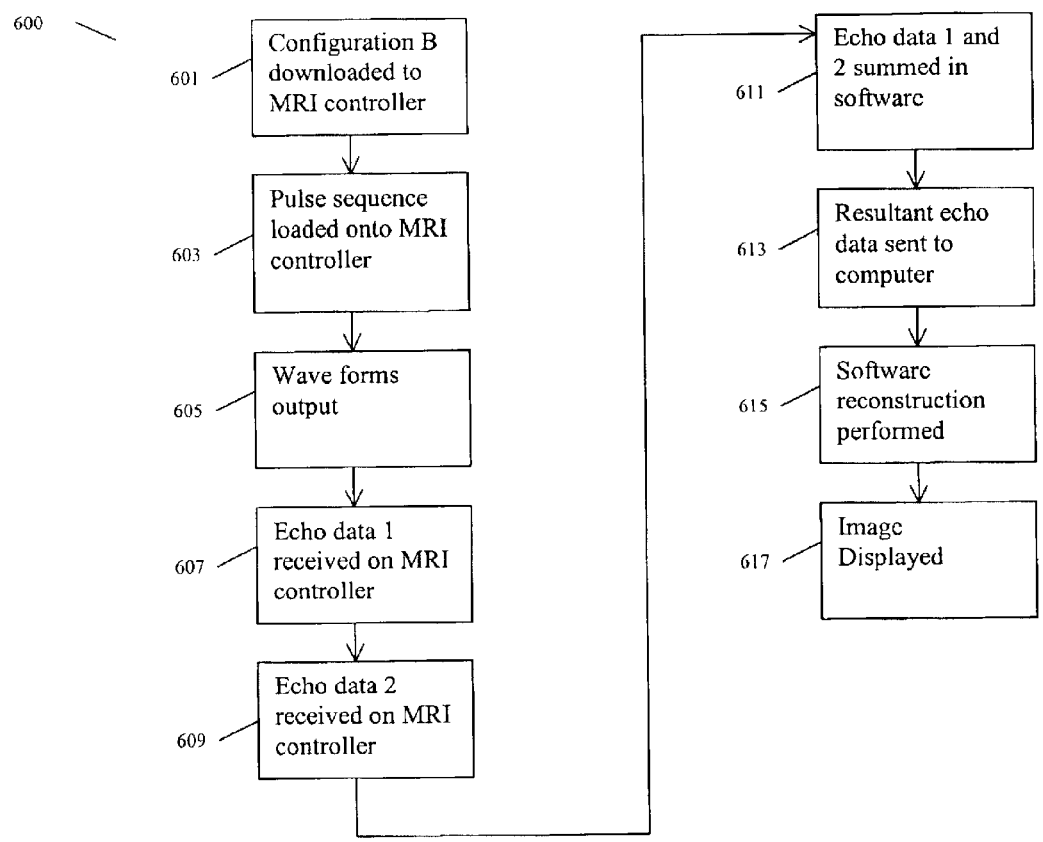
FIG. 6 illustrates a flowchart showing the operation of a reconfigurable MRI machine according to the principles of the present invention performing digital signal processing.

In another embodiment, the MRI controller 106 is optimally reconfigured to facilitate digital signal processing. Signal processing algorithms, such as filtering, decimation, summing, etc., may be performed on the MRI apparatus 100 by reconfiguring the hardware of the MRI controller 106. The appropriate hardware configuration is loaded onto the MRI controller 106 before the MRI scan is started. With reference now to FIGS. 4 to 6 of the Drawings, the effect of reconfiguring the controller 106 to improve digital signal processing is shown.

The operation of an MRI apparatus 100 with a conventional, statically-configured controller 106 is shown in FIG. 4, and designated therein by reference numeral 400. An initial generic hardware configuration A of the MRI controller is downloaded to the controller 106 (step 401). Alternately, the MRI controller 106 may be a statically-configured controller 106 already having the generic hardware configuration A. In either case, the generic configuration A is designed to perform the generic controller functions optimally. The generic configuration A is not designed to perform specialized functions such as digital signal processing on the received data. Also, a pulse sequence is loaded onto the MRI controller 106 (step 403). This pulse sequence may be any conventional or customized pulse sequence. It should, of course, be understood that different controllers have different generic hardware configurations pursuant to their manufacturer.

With reference again to FIG. 4 of the Drawings, after the hardware configuration and pulse sequence are loaded into the MRI controller, the MRI scan can begin. The controller 106 generates waveforms (step 405), and the signal generator 108 produces digitizing pulses therefrom. The data from the digitizing pulses, e.g., echo, spectroscopic, free induction decay and other signals, is received and sent to the MRI controller 106 for storage (step 407), then sent to the computer 112 (step 409). For illustrative purposes only, echo data is shown in FIG. 4. On the computer 112, software reconstruction of the echo or other data produces useful image data that reconstructs the physical information observed by the MRI machine (step 411) and displays the image data in a visual format on a display screen or monitor 114 (step 413).

The operation of the MRI apparatus 100 with the generic hardware configuration of the controller 106 (as shown in FIG. 4) and with additional signal processing done in software is shown in FIG. 5, the steps for which being designated by reference numeral 500. Similar to the operation shown in FIG. 4, a generic hardware configuration A is downloaded to the MRI controller 106 (step 501). Again, the hardware configuration A may alternately be pre-existing on the MRI controller 106, rather than downloaded to the controller 106. The pulse sequence is also loaded onto the MRI controller 106 (step 503). As above, the pulse sequence may be any conventional or customized pulse sequence.

Similar to the operation shown in FIG. 4, after the hardware configuration and pulse sequence are loaded into the MRI controller 106, the MRI scan can begin, and the controller 106 generates waveforms (step 505), and the signal generator 108 produces the requisite digitizing pulses. First echo data 1 from the digitizing pulses is received and sent to the MRI controller 106 for storage (step 507), and second echo data 2, from a different set of scanning parameters is received and sent to the MRI controller 106 for storage (step 509). The echo data 1 and 2 are then sent to the computer 112 (step 511). As discussed, spectroscopic, free induction decay and other data may alternatively be utilized.

On the computer 112, the echo data 1 and 2 are summed in a software application (step 513). After the data is digitally processed, the echo data is reconstructed in software to produce useful image data that reconstructs the physical information observed by the MRI machine (step 515). This image data is then displayed in a visual format on a display screen or monitor 114 (step 517).

The operation of an MRI apparatus 100 reconfigured to perform signal processing is shown in FIG. 6 and designated therein by reference numeral 600. An initial custom hardware configuration B of the MRI controller 106 is downloaded to the controller 106 (step 601). The custom hardware configuration B may be designed to optimally run a particular pulse sequence, or may be generically designed to run a variety of pulse sequences. The hardware configuration B is optimally designed to perform digital signal processing on the received data. In this case, the hardware configuration B is designed to perform a summing function on the received data, but the hardware configuration may be designed to perform any digital signal combination, singly or in combination, including decimation, filtering, etc. A pulse sequence, which may be a particular pulse sequence optimized by the MRI controller 106 or may be any pulse sequence, is loaded onto the MRI controller 106 (step 603).

Similar to the operation shown in FIG. 5, after the hardware configuration and pulse sequence are loaded into the MRI controller 106, the MRI scan can begin, the controller 106 generates waveforms (step 605), and the signal generator 108 produces digitizing pulses. First echo data 1 from the digitizing pulses is received and sent to the MRI controller 106 for storage (step 607), and second echo data 2, from a different set of scanning parameters is also received and sent to the MRI controller for 106 storage (step 609). When both echo data 1 and echo data 2 are received at the MRI controller 106, the MRI controller 106 performs a digital signal processing function on the received data (step 611). In this example, the echo data 1 and the echo data 2 are summed on the MRI controller 106, before the resultant data is then sent to the computer 112 (step 613).

As in the operation shown in FIGS. 4 and 5, after the data is digitally processed, the echo data is reconstructed in software to produce useful image data that reconstructs the physical information observed by the MRI machine (step 615). This image data may then be displayed in a visual format on a display screen or monitor 114 (step 617).

As discussed, echo data has been used illustratively, and other types of data may be employed, as are well understood to those skilled in the art.

Performing the digital signal processing function on the MRI controller 106 rather than in a software application has several advantages. When the data is summed on the computer 112 rather than the controller 106, twice as much data is sent to the computer 112 than if the data is summed on the controller 106 before sending the data to the computer 112. Also, when the data is summed on the computer 112, the summation cannot begin until all echo data is received on the computer 112, which is slower than performing the summation with only part of the data received.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A magnetic resonance imaging system for imaging an object, said magnetic resonance imaging system comprising:

a pulse sequence generator for imaging said object, said pulse sequence generator generating pulse sequences for said imaging, and a controller operating said pulse sequence generator and said pulse sequences, said controller having a plurality of hardware configurations corresponding to a plurality of pulse sequences, said controller, in response to a reconfigure command, reconfiguring the hardware configuration from a first configuration to a second configuration by downloading a new pulse sequence from the pulse sequence generator to the controller and reconfiguring the hardware configuration of the controller based upon the new pulse sequence.

2. The system according to claim 1, wherein a given pulse sequence controlled by said controller in said second configuration is more efficient than if controlled by said controller in said first configuration.

3. The system according to claim 2, wherein said controller is optimized to run said given pulse sequence.

4. The system according to claim 1, wherein said controller is optimized to perform a digital signal processing function.

5. The system according to claim 4, wherein the digital signal processing function is selected from the group consisting of summing, decimation, and filtering.

6. A magnetic resonance imaging controller for use in a magnetic resonance imaging machine, said controller comprising:

means for receiving a custom hardware configuration;

means for receiving a pulse sequence;

means for reconfiguring from a first hardware configuration to said custom hardware configuration by downloading the received pulse sequence from a pulse sequence generator to the controller and reconfiguring the first hardware configuration of the controller based upon the received new pulse sequence; and means for sending said pulse sequence to a sequence generator.

7. The system according to claim 6, wherein said pulse sequence controlled by said controller in said custom configuration is more efficient than if controlled by said controller in said first configuration.

8. The system according to claim 7, wherein said controller is optimized to run said pulse sequence.

9. The system according to claim 6, wherein said controller is optimized to perform a digital signal processing function.

10. The system according to claim 9, wherein the digital signal processing function is selected from the group consisting of summing, decimation, and filtering.

11. A method for optimizing the performance of a magnetic resonance imaging machine, said method comprising the steps of:

downloading a pulse sequence from a pulse sequence generator to a controller of the magnetic resonance imaging machine;

downloading a custom hardware configuration to a controller of the magnetic resonance imaging machine based upon the downloaded pulse sequence from the pulse sequence generator;

reconfiguring said controller pursuant to said custom hardware configuration;

loading the pulse sequence onto the controller to be used in accordance with said custom hardware configuration; and scanning with the magnetic resonance imaging machine.

12. The method according to claim 11, wherein the controller is optimized to run a particular pulse sequence.

13. The method according to claim 11, wherein the controller is optimized to perform a digital signal processing function.

14. The method according to claim 13, wherein the digital signal processing function is selected from the group consisting of summing, decimation, and filtering.

* * * * *